United States Patent
Kirmani et al.

(10) Patent No.: US 10,444,865 B2
(45) Date of Patent: Oct. 15, 2019

(54) TRACKING OF POSITION AND ORIENTATION OF OBJECTS IN VIRTUAL REALITY SYSTEMS

(71) Applicant: GOOGLE LLC, Mountain View, CA (US)

(72) Inventors: Ghulam Kirmani, Sunnyvale, CA (US); Andrea Colaco, Sunnyvale, CA (US); Luis Villaran, San Carlos, CA (US); Chintan Trehan, San Jose, CA (US)

(73) Assignee: GOOGLE LLC, Mountain View, CA (US)

( * ) Notice: Subject to any disclaimer, the term of this patent is extended or adjusted under 35 U.S.C. 154(b) by 0 days.

(21) Appl. No.: 15/964,499

(22) Filed: Apr. 27, 2018

(65) Prior Publication Data
US 2018/0314346 A1   Nov. 1, 2018

Related U.S. Application Data

(60) Provisional application No. 62/492,801, filed on May 1, 2017.

(51) Int. Cl.
*G06F 3/0346* (2013.01)
*H03K 19/177* (2006.01)
*G02B 27/01* (2006.01)
*G06F 3/01* (2006.01)
*G06F 3/03* (2006.01)

(52) U.S. Cl.
CPC ......... *G06F 3/0346* (2013.01); *G02B 27/017* (2013.01); *G02B 27/0172* (2013.01); *G06F 3/011* (2013.01); *G06F 3/017* (2013.01); *G06F 3/0304* (2013.01); *G06F 3/0325* (2013.01);
(Continued)

(58) Field of Classification Search
None
See application file for complete search history.

(56) References Cited

U.S. PATENT DOCUMENTS 7,368,999 B2   5/2008   Natzke
8,179,604 B1 *  5/2012   Prada Gomez .... G02B 27/0093
                                                                    345/8
(Continued)

FOREIGN PATENT DOCUMENTS

WO   2017007637 A1   1/2017

OTHER PUBLICATIONS

International Search Report and Written Opinion for PCT Application No. PCT/US2018/030095, dated Aug. 6, 2018, 15 pages.

*Primary Examiner* — Chad M Dicke
(74) *Attorney, Agent, or Firm* — Brake Hughes Bellermann LLP

(57) ABSTRACT

Techniques of tracking a hand controller in a VR system involves detecting, by photodiodes in the hand controller, patterns of diffuse radiation generated by diffuse LEDs in the HMD. Such techniques can also include comparing the detected patterns to those simulated offline previously and represented in a lookup table (LUT). By looking up the detected patterns in the LUT, the VR system may determine the position and/or orientation of the hand controller with sub-millimeter accuracy. Some advantages of the improved techniques can be in the simplicity and/or low cost of the components without sacrificing accuracy in deriving the position and orientation of the hand controller.

20 Claims, 15 Drawing Sheets

(52) U.S. Cl.
CPC ... *H03K 19/17728* (2013.01); *G08C 2201/32* (2013.01)

(56) References Cited

U.S. PATENT DOCUMENTS

| | | | | |
|---|---|---|---|---|
| 9,961,236 | B2* | 5/2018 | Chen | H04N 1/6019 |
| 9,983,665 | B2* | 5/2018 | Hall | G02B 27/0172 |
| 10,043,282 | B2* | 8/2018 | Smits | G01P 3/36 |
| 10,146,334 | B2* | 12/2018 | Balan | H04N 13/204 |
| 10,146,335 | B2* | 12/2018 | Balan | H04N 13/204 |
| 2002/0024675 | A1* | 2/2002 | Foxlin | G02B 27/017 356/620 |
| 2007/0159455 | A1* | 7/2007 | Lin | G06F 3/011 345/156 |
| 2009/0322673 | A1* | 12/2009 | Cherradi El Fadili | G06F 3/017 345/157 |
| 2011/0142353 | A1* | 6/2011 | Hoshino | G06K 9/00375 382/203 |
| 2014/0049558 | A1* | 2/2014 | Krauss | G06F 3/011 345/633 |
| 2014/0055352 | A1* | 2/2014 | Davis | G06F 3/017 345/156 |
| 2014/0362110 | A1 | 12/2014 | Stafford | |
| 2015/0061509 | A1* | 3/2015 | Karlicek | G06K 9/00369 315/153 |
| 2015/0062086 | A1* | 3/2015 | Nattukallingal | G06F 3/016 345/175 |
| 2015/0258431 | A1* | 9/2015 | Stafford | A63F 13/213 463/31 |
| 2015/0261291 | A1 | 9/2015 | Mikhailov et al. | |
| 2016/0117081 | A1* | 4/2016 | Pujia | G06F 3/04842 715/771 |
| 2016/0131761 | A1* | 5/2016 | Yates | G01S 7/481 356/3.11 |
| 2016/0364910 | A1* | 12/2016 | Higgins | G02B 27/017 |
| 2017/0010688 | A1* | 1/2017 | Fahraeus | G06F 3/0421 |
| 2017/0038253 | A1 | 2/2017 | Mallinson | |
| 2018/0097975 | A1* | 4/2018 | Osman | H04N 13/106 |

* cited by examiner

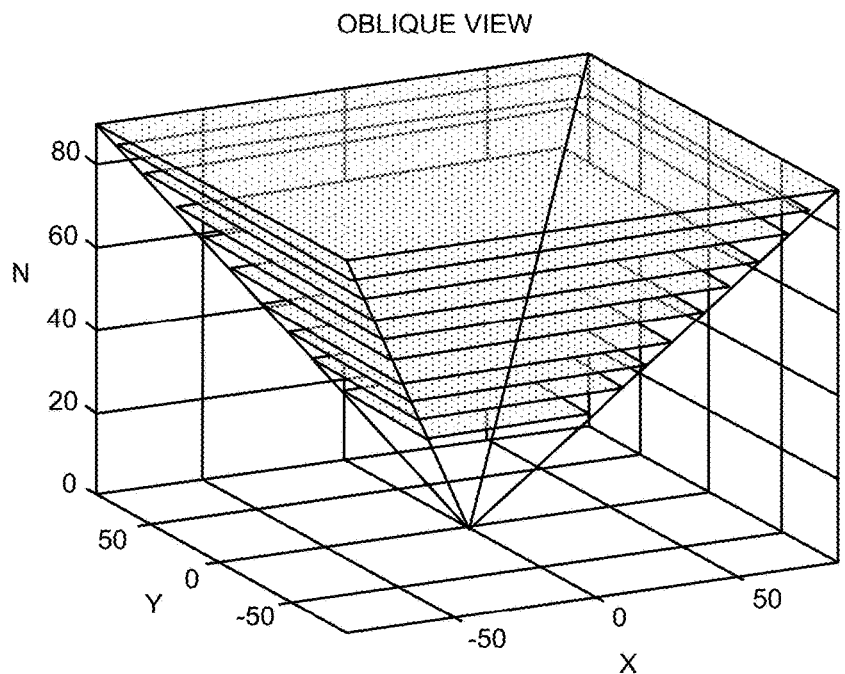
FIG. 5A
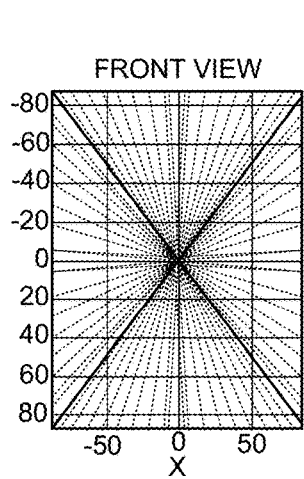 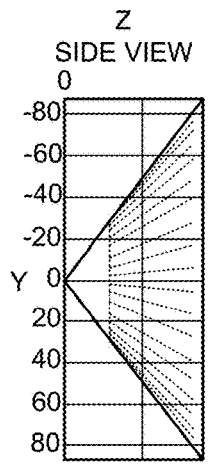 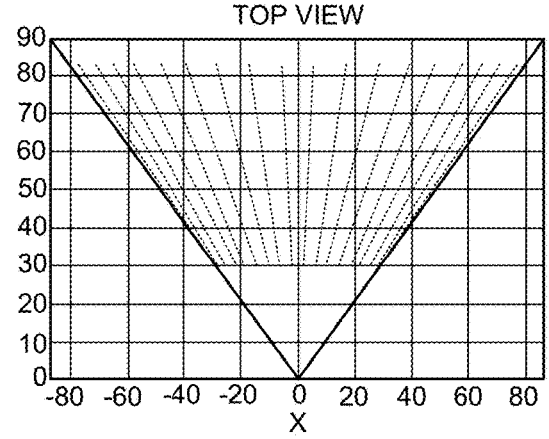
FIG. 5B  FIG. 5C  FIG. 5D

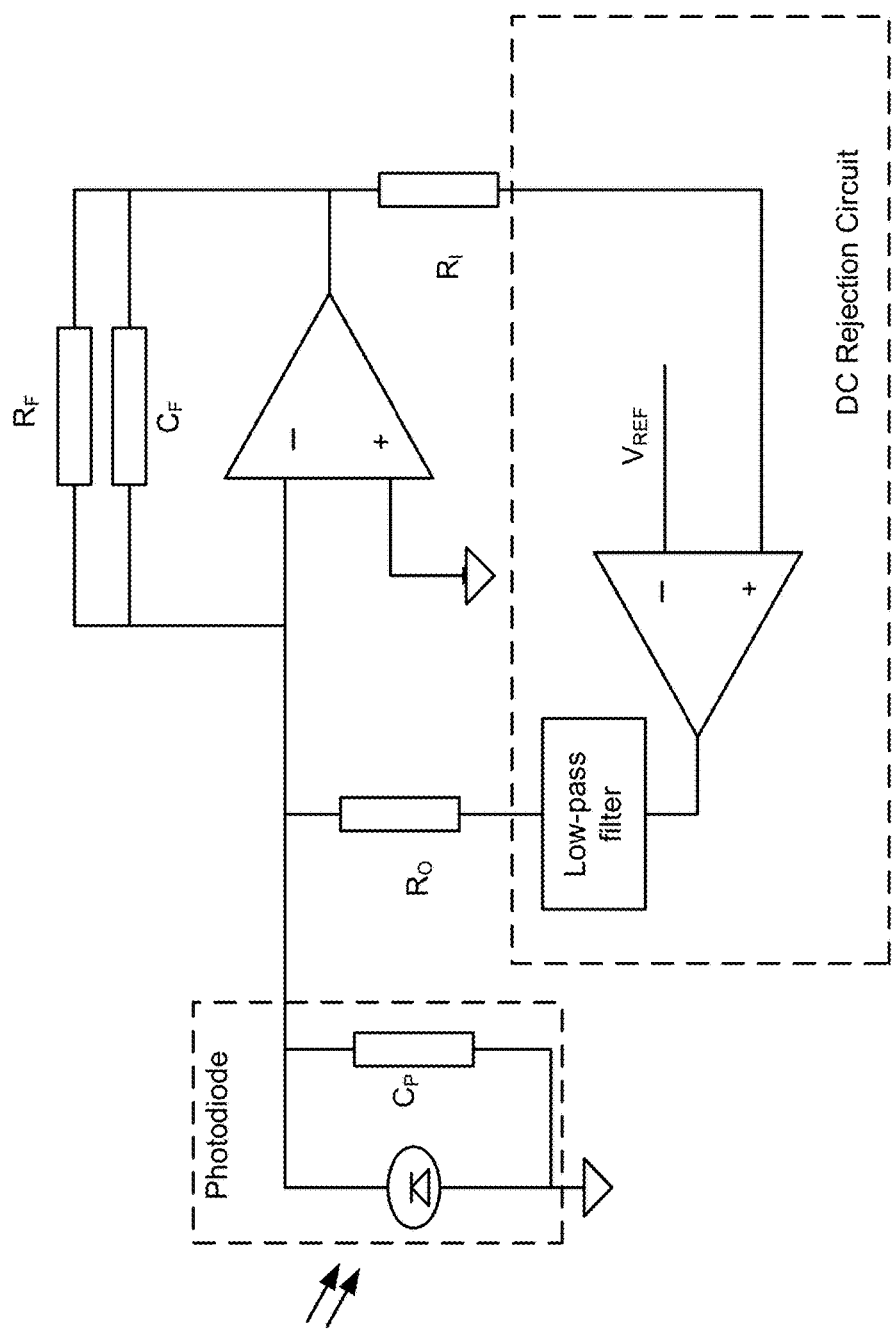

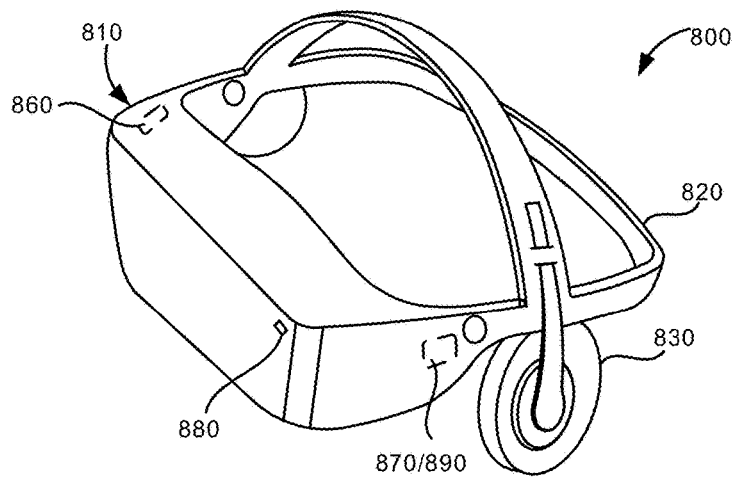
FIG. 12A
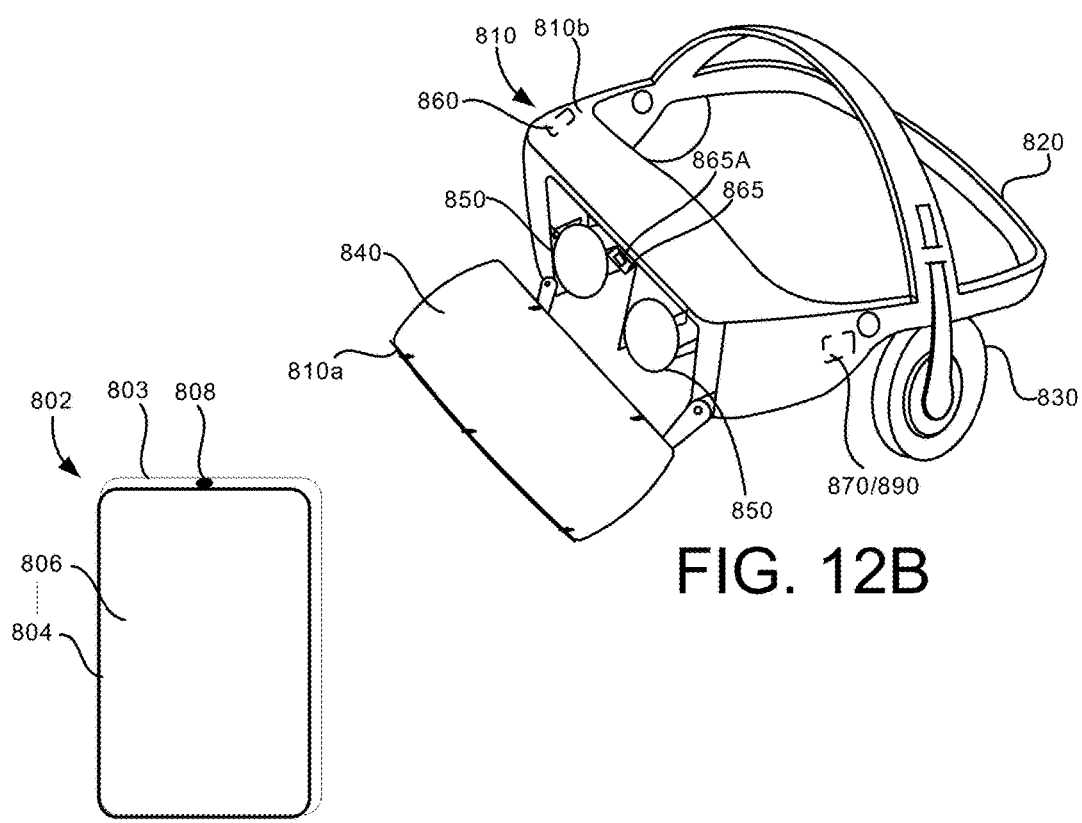
FIG. 12B
FIG. 12C

TRACKING OF POSITION AND ORIENTATION OF OBJECTS IN VIRTUAL REALITY SYSTEMS

CROSS-REFERENCE TO RELATED APPLICATIONS

This application claims priority to U.S. Patent Application No. 62/492,801, filed on May 1, 2017, entitled "TRACKING OF POSITION AND ORIENTATION OF OBJECTS IN VIRTUAL REALITY SYSTEMS", the disclosure of which is incorporated by reference herein in its entirety.

TECHNICAL FIELD

This description relates to tracking three-dimensional position and orientation of real objects used in virtual reality (VR) systems.

BACKGROUND

In some VR systems, a user interacts with any number of virtual objects in a virtual environment using a head-mounted display (HMD) and a pair of hand controllers. In such VR systems, the user sees and hears the objects with the HMD while the VR system tracks the controller's position and orientation using the hand controllers. The VR system then feeds back the controller's six degrees of freedom (6DOF), i.e., three-dimensional position and orientation, to the HMD to update the user's view within the virtual environment.

SUMMARY

In one general aspect, a VR system can include a hand controller and a HMD. In this VR system, a method can include receiving, by processing circuitry, a pulse of diffuse electromagnetic radiation from a plurality of radiation transmitters placed in the HMD. The method can also include generating, by the processing circuitry, a digital signal from the diffuse electromagnetic radiation. The method can further include obtaining, by the processing circuitry, a position and an orientation of the hand controller based on the digital signal.

The details of one or more implementations are set forth in the accompanying drawings and the description below. Other features will be apparent from the description and drawings, and from the claims.

BRIEF DESCRIPTION OF THE DRAWINGS

FIGS. 5A, 5B, 5C, and 5D are diagrams of an example set of possible three-dimensional coordinates that the hand controller can occupy in space.

FIG. 9B is a diagram illustrating an example circuit for rejecting DC light from external sources.

FIGS. 12A, 12B, and 12C are diagrams depicting the example VR HMD and controller.

DETAILED DESCRIPTION

Conventional VR systems require an external system to provide tracking data for an object such as a hand controller. An example of such an external system takes the form of a pair of fixed transmitters ("base stations") placed in, for example, opposite corners of a room. Such transmitters use collimated near-infrared (NIR) laser or LED illumination to raster scan a scene using a rotating motor configuration. In the implementations described herein, an object may not be tracked via high-bandwidth sensors that collect the focused illumination data and produce object position and orientation from the illumination data. In the implementations described herein, fixed transmitters that require a large space, i.e., an entire room, and costly optics to collimate illumination may not be needed. Further, in the implementations described herein, high-bandwidth sensors that can introduce unwanted sensitivity to optical noise may be eliminated.

In accordance with the implementations described herein, improved techniques of tracking a hand controller in a VR system involves detecting, by photodiodes in the hand controller, patterns of diffuse radiation generated by diffuse LEDs in the HMD. The apparatus and methods can also include comparing the detected patterns to those simulated offline previously and represented in a lookup table (LUT). By looking up the detected patterns in the LUT, the VR system may determine the position and/or orientation of the hand controller with sub-millimeter accuracy. Some advantages of the improved techniques can be in the simplicity and/or low cost of the components without sacrificing accuracy in deriving the position and orientation of the hand controller. There is no need to dedicate a large space for using the improved VR system. The optical elements that generate diffuse radiation and the photodiodes in the hand controllers are less expensive than those required for collimation. Further, novel circuitry applied to the photodiodes provides low sensitivity of the improved VR system to external light.

Figure 1A:
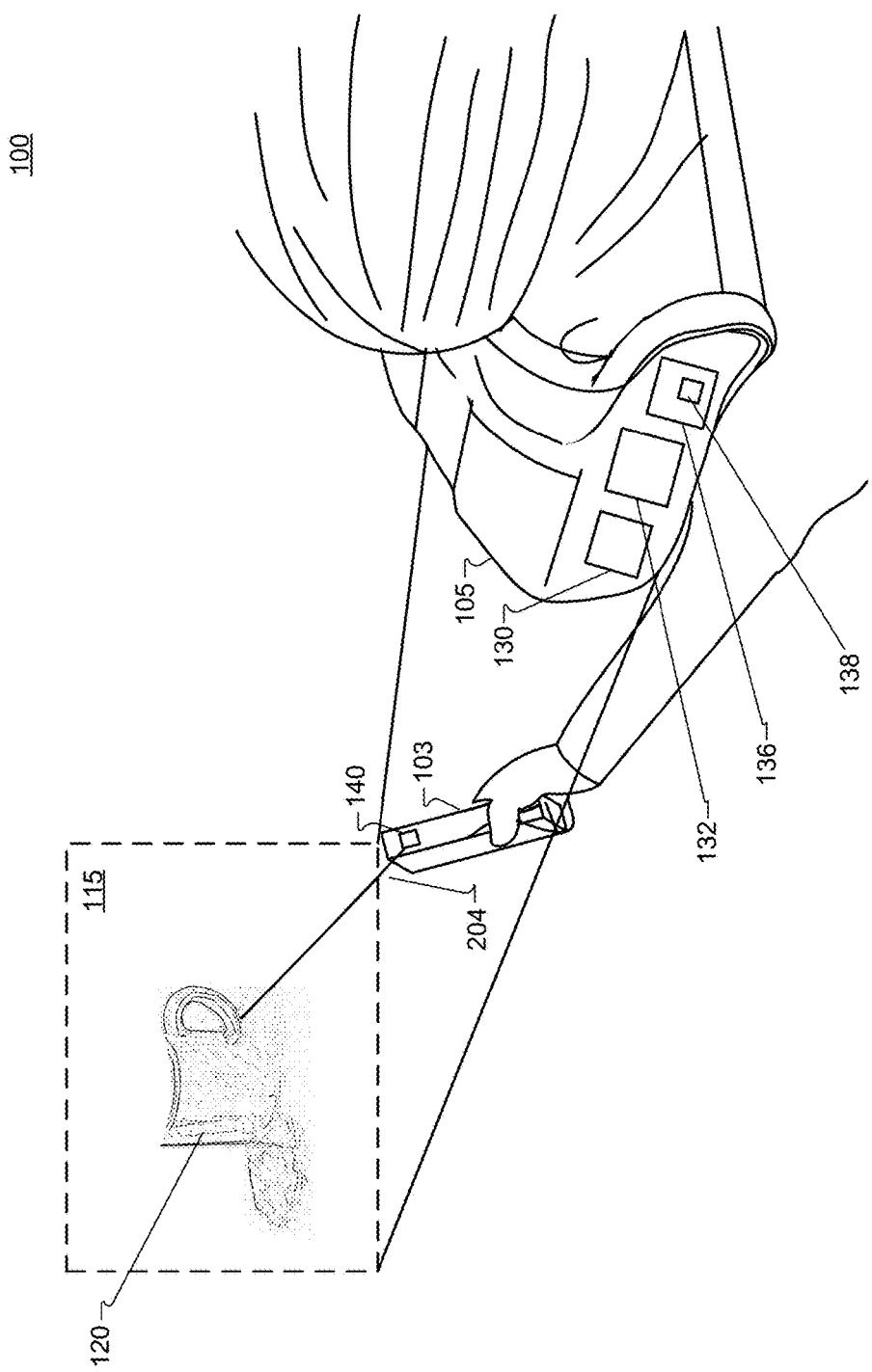
FIG. 1A is a diagram that illustrates an example HMD and hand controller in a VR system.

FIG. 1A illustrates an example VR system 100 including a HMD 105 and a hand controller 103. The HMD 100 fits over a user's head and covers his/her eyes with a display 204, shown as projected in front of the user. The display 204 inside the HMD 105 shows a virtual environment 115 to the user. In this particular user environment 115, there is a virtual object 120. The user may manipulate the virtual object 120 using the hand controller 103.

The VR system 100 uses the hand controller 103 to track the user's movements and thus determine what to display in the virtual environment 115. In particular, the VR system 100 is configured to track the position and, in some cases, the orientation of the hand controller 103. Accordingly, it is important that the VR system be able to track position and orientation of the hand controller 103 with sufficient accuracy, typically within a millimeter.

According to the improved techniques, the VR system 100 tracks the hand controller 103 using diffuse electromagnetic radiation (e.g., near-infrared radiation) generated by radiation sources 130 (e.g., LEDs) in the HMD 105. Such radiation sources 130 may be arranged in an array within the helmet, e.g., within a housing of the HMD 105.

As part of this tracking of the hand controller, the hand controller 103 includes a radiation detector 140. In some implementations such as those described herein, the radiation detectors include photodiodes. In some implementations, the radiation detectors may include photomultiplier tubes, charged-coupled devices, and the like.

As illustrated in FIG. 1A, the HMD also includes processing circuitry 132. The processing circuitry 122 is configured to detect signals generated in the hand controller 103 by the radiation detector 140 in response to receiving the emitted radiation and determine the position and/or orientation of the hand controller 103 based on the detected signals. In some arrangements, the processing circuitry 132 is also coupled to a memory 136 that stores a LUT 138. In such arrangements, the processing circuitry 132 is configured to perform a comparison operation on the detected signals and the LUT 138 in memory 136.

As will be described herein, the VR system 100 is configured to process, via processor 132, simulations of the radiation sources 130 and radiation detector 140, as well as the signals generated by circuitry in the detectors, to build the LUT 138.

In some arrangements, the processing circuitry 132 and memory 136 is located outside the HMD in, for example, the hand controller 103 or a computer external to the hand controller 103 and the HMD 105.

Figure 1B:
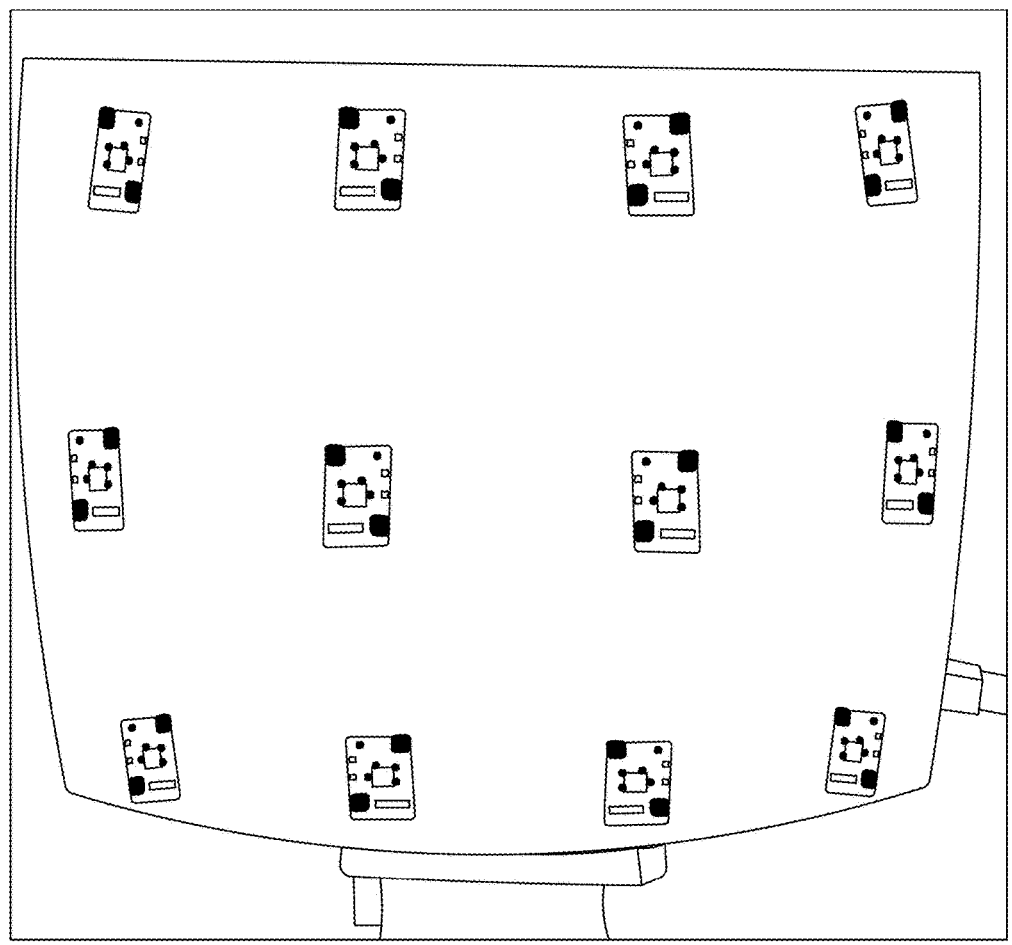
FIG. 1B is a diagram that illustrates example LED transmitters that are included in a HMD.

FIG. 1B illustrates example LED transmitters that may be included in a HMD such as HMD 105 (FIG. 1A). In FIG. 1B, there are twelve LEDs arranged on a curved surface that is to be embedded in a HMD. Each of the LEDs is soldered onto a printed circuit board and draws power from the HMD. In some implementations, the LEDs emit electromagnetic radiation at a near-infrared (NIR) wavelength (e.g., between 700 nm and 1000 nm). In some implementations, the LEDs emit such radiation at optical wavelengths, mid-infrared wavelengths, far-infrared wavelengths, and microwave wavelengths.

As will be demonstrated herein, it is advantageous to simulate the radiation patterns emitted by the radiation sources in the HMD 105 so that actual radiation patterns, when detected at the hand controller 103, may determine the position and orientation of the hand controller 103. To this effect, each radiation source 130 emits radiation according to a known brightness profile, and such a profile may be used to determine the brightness received at the hand controller 103. Because the hand controller 103 includes a radiation detector 140, e.g. photodiodes that convert radiation energy into electrical energy, the position and orientation of the hand controller 103 will dictate the radiation profile received at the detector 140. Circuitry at the detector 140 generates an electrical signal based on the received profile that may also be simulated. It is the signal generated by this circuitry that is recorded in the LUT 138 in memory 136. In some implementations, including those discussed herein, there may be multiple radiation detectors in the hand controller 103.

Figure 1C:
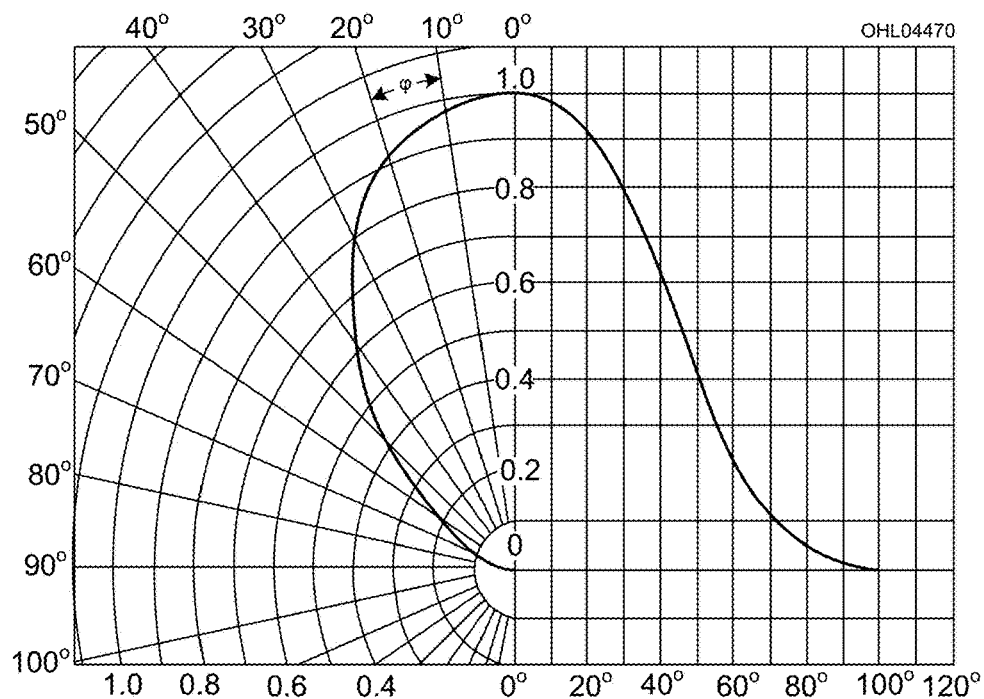
FIG. 1C is a diagram illustrating example brightness profiles of typical LEDs.
Figure 1D:
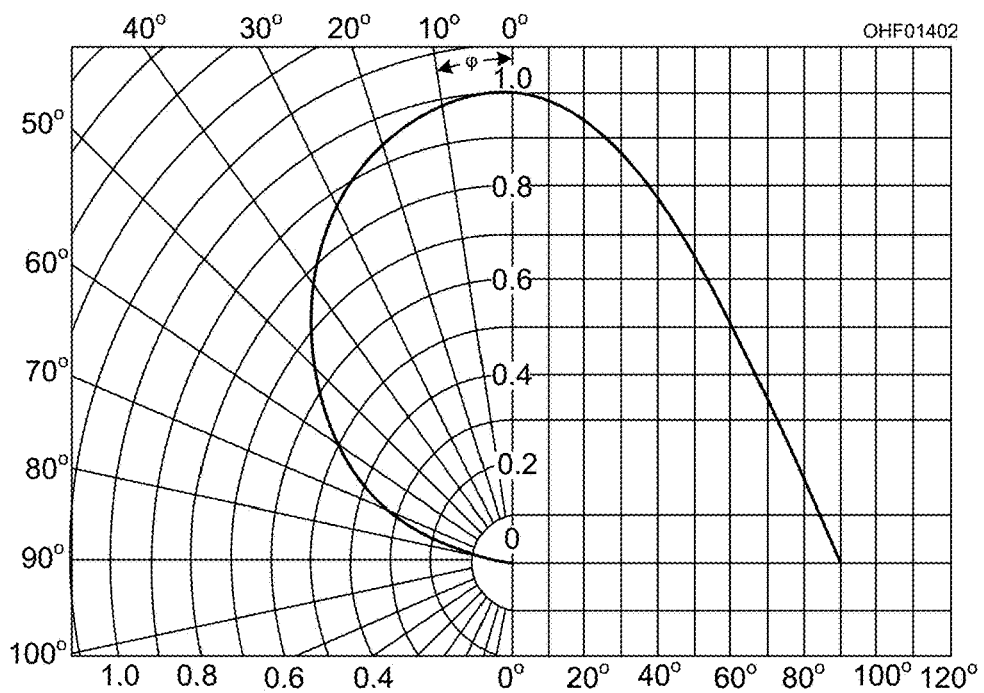
FIG. 1D is a diagram illustrating another example brightness profile of LEDs.

FIGS. 1C and 1D is a diagram illustrating an example pair of radiation brightness graphs that are typical of the LEDs illustrated in FIG. 1B for NIR wavelengths. Such a brightness profile may be used in the implementations described herein to simulate the radiation signals received by the hand controller 103. In each graph is a pair of plots: a polar plot on the left and a cartesian plot on the right. The polar plot illustrates one-half of a radiation profile in which the brightness is a function of polar angle with respect to a vertical axis of an LED. The cartesian plot illustrates the same plot but illustrating a more detailed examination of small values of the brightness.

As shown in FIG. 1C, the graph shows a relatively narrow brightness profile, i.e., the brightness decreases relatively quickly away from a vertical axis of the LED. The cartesian plot, however, shows that the brightness decreases more slowly toward a horizontal axis of the LED. In contrast, the graph in FIG. 1D shows a relatively broad profile, i.e., the brightness decreases relatively slowly away from a vertical axis of the LED. The cartesian plot, however, shows that the brightness decreases more quickly toward a horizontal axis of the LED.

Figure 2:
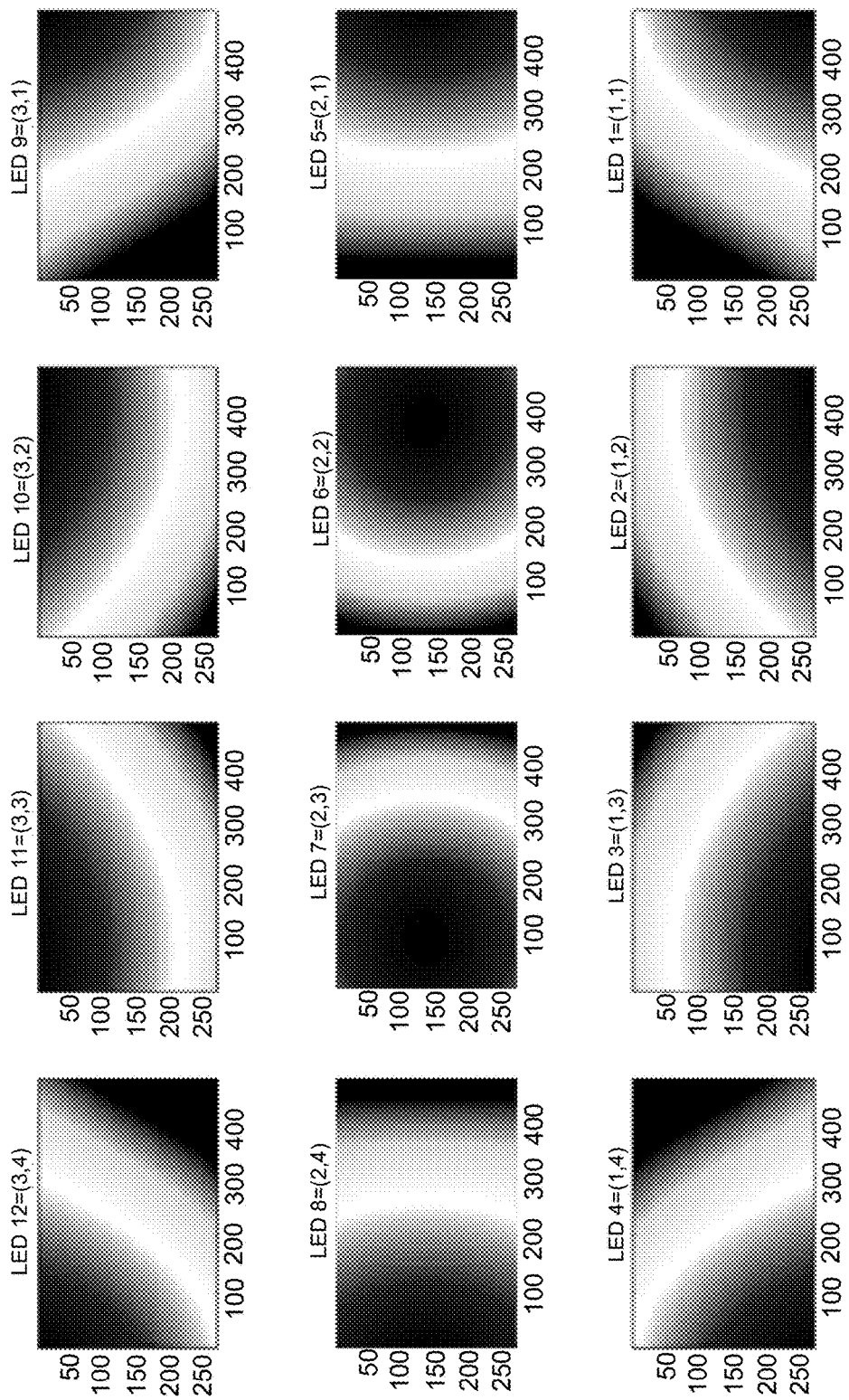
FIG. 2 is a diagram illustrating example simulated plots of the LEDs given the brightness profiles shown in FIG. 1B.

FIG. 2 is a diagram illustrating an array of plots of simulated radiation received at a photodiode in the hand controller 103 for each LED radiation transmitter. The simulations used positions and orientations of the twelve LEDs shown in FIG. 1B along with the brightness data, examples of which were shown in FIGS. 1C and 1D. Each of the plots is a planar heat map in which bright represents regions of highest received intensity and dark represents regions of lowest received intensity. The horizontal and vertical axes of each plot represent positions along a reception area in the hand controller, e.g., just above a photodiode.

Figure 3A:
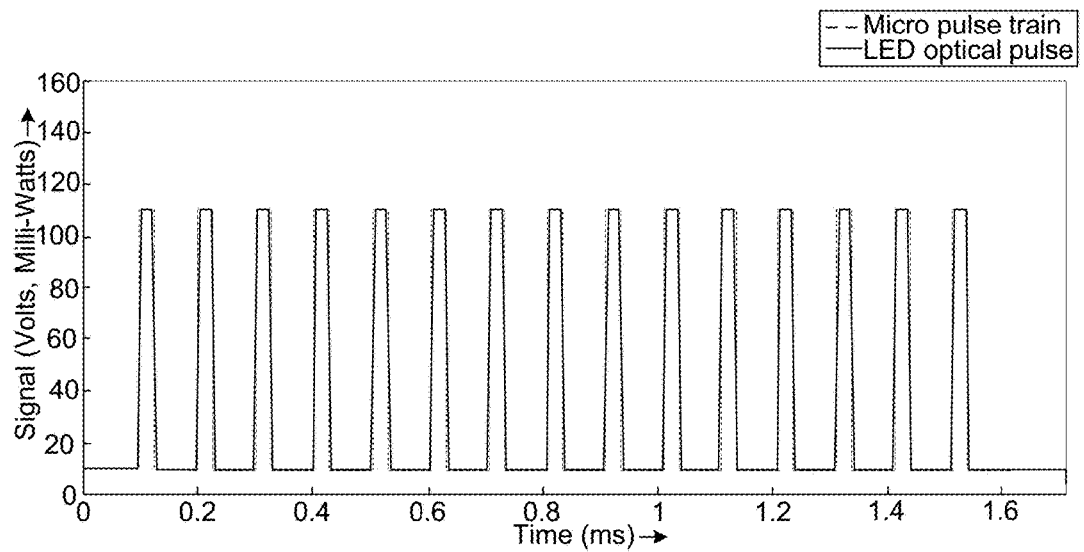
FIGS. 3A and 3B are diagrams illustrating example temporal profiles of pulsed radiation emitted from the LEDs shown in FIG. 1 prior to bandpass filtering and after bandpass filtering.

FIG. 3A is a diagram illustrating a plot of example simulated radiation pulse trains over a millisecond time scale. The plot in FIG. 3A represents an integrated intensity (over an area of the photodiode) of a pulse train resulting from a pulse of diffuse electromagnetic radiation received from the LEDs and incident on a photodiode and then subject to an analog-to-digital conversion (ADC). The period of the digital pulse is a little greater than 0.1 ms.

The temporal aspect of the pulsed signals resulting from the diffuse radiation imply that the patterns in the LUT should be time-dependent. Accordingly, as will be demonstrated herein, the process of comparing a real signal to a pattern in the LUT involves synchronizing the real signal to the LUT to determine the correct phase of the pattern.

The frequency components of the pulse trains in the top plot may include large amounts of frequencies centered on about 1000 Hz (1/period of the trains), but also with some amount of low frequencies (associated with the DC part of the signal) and smaller amounts of high frequencies. Both the low and high frequency components may be associated with various noise contributions that are not desired and could cause inaccuracies in deriving the position and orientation of the hand controller 103. Accordingly, the VR system 100, in some implementations, may include a bandpass filter. The result of an example bandpass filter applied to the example pulse train is shown in the bottom plot.

Figure 3B:
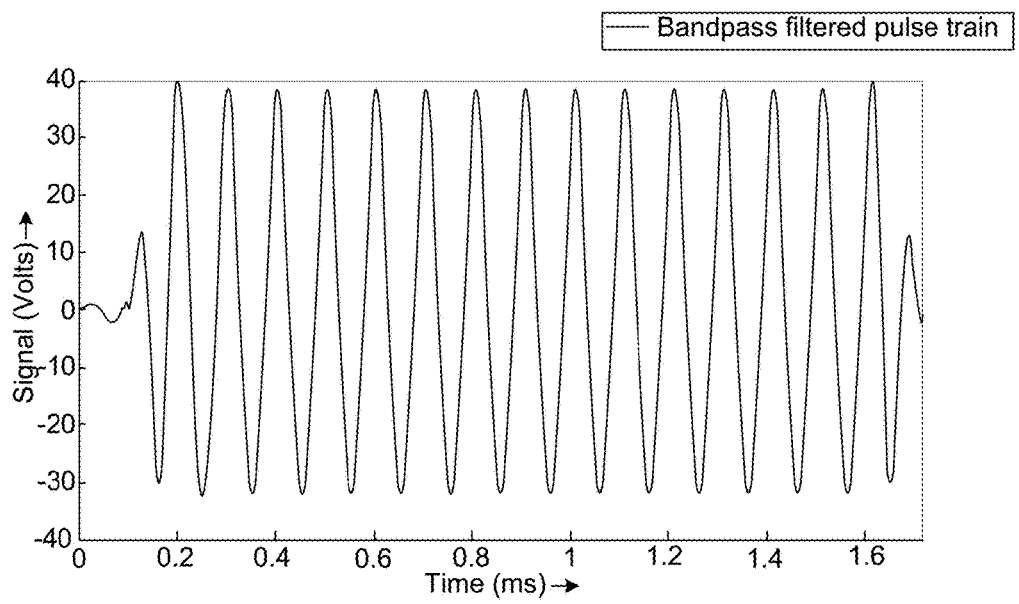

FIG. 3B is a plot that shows a filtered signal voltage in volts against time in milliseconds. The period of the filtered pulse train is the same as the unfiltered pulse train, but the amplitude and phase have changed. It is this bandpass filtered pulse train that determines the phase of the patterns in the LUT 138.

As discussed above, the simulation of the radiation at the hand controller is needed to build the LUT 138 used to determine the position and orientation of the hand controller in response to the hand controller 105 receiving radiation from the sources 130 in the HMD 105. The above discussion illustrated spatial and temporal properties of the radiation received at the hand controller 103. In addition, properties of the receiver may also be needed for accurate simulation of the actual electrical signals received by the VR system 100.

Figure 4A:
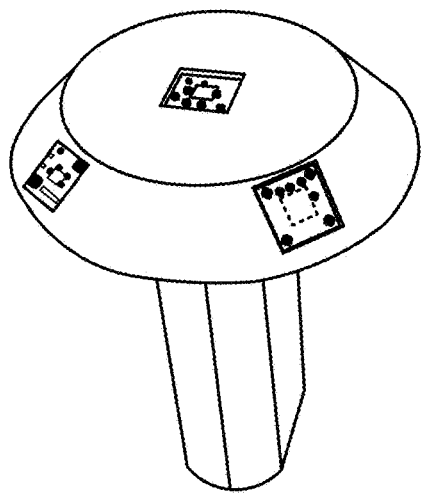
FIG. 4A is a diagram of an example set of photodiodes located in a hand controller.

FIG. 4A illustrates an example set of photodiode radiation detectors 140 (see FIG. 1A) in a hand controller 103. The photodiodes are arranged along the surface of the hand controller 103 in a prespecified pattern and each photodiode produces its own signal in response to the radiation incident on its surface.

Figure 4B:
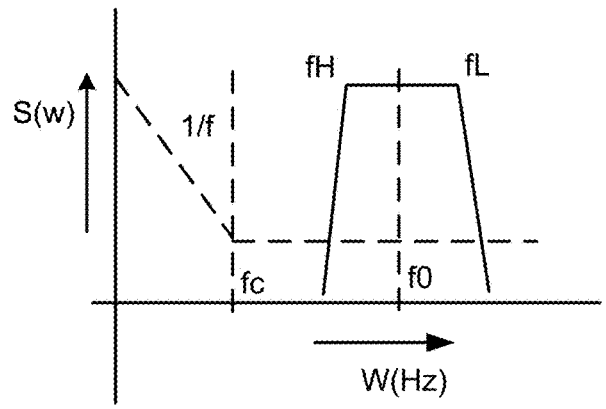
FIG. 4B is a diagram of an example response of a typical photodiode in the hand controller.

FIG. 4B is a plot of an example transfer function of a photodiode in the hand controller. In this plot, the transfer function is typical of a bandpass filter, being zero below a low frequency fH and a high frequency fL. The plot further illustrates a noise profile of the photodiode in which 1/f noise is expected below a critical frequency fc<fH and a DC noise above the critical frequency fc.

Figure 4C:
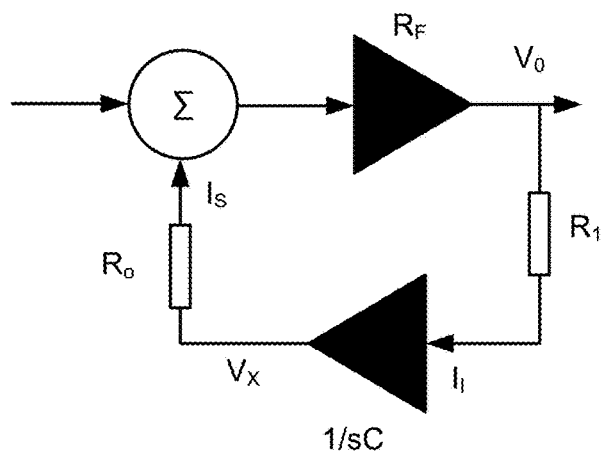
FIG. 4C is a diagram of an example circuit that provides bandpass filtering for the typical photodiode in the hand controller.

FIG. 4C is a schematic circuit diagram of the photodiode and bandpass filter. The circuit diagram shows two operational amplifiers: a first to amplify the signal produced by the incident pulse of diffuse radiation, and a second to cancel out current produced by ambient light. Such an arrangement makes the photodiode used in the hand controller robust in the face of ambient light and other DC noise.

Once the VR system 100 determines the signal received and processed via the hand controller 103, the VR system 100 then determines the position of the hand controller 103. There are typically a set of possible positions of the hand controller, constrained due to the configuration of the VR system (e.g., connection of the hand controller to the VR system, etc.)

FIG. 5A is a diagram illustrating an example restricted space of hand controller positions. The restricted space in FIG. 5A takes the form of a solid object in three-dimensional coordinate space. The solid object, shaped like an inverted pyramid, represents the set of all possible positions in space that can be occupied by the hand controller. For each point in this solid object, there is a set of all possible orientations in which the hand controller may be held for that point. For discrete sampling, each possible discrete position is represented as a voxel, or volume pixel, i.e., a three-dimensional pixel. FIGS. 5B, 5C, and 5D illustrate, top, side, and front views of the restricted space, respectively.

It is recalled that, in FIG. 4A, that there are typically multiple photodiodes in a hand controller 103. Each photodiode produces its own pulse train signal for the VR system. The LUT ultimately may represent each signal separately. The LUT 138 may combine the signals into a single signal, e.g., by averaging.

Figure 6:
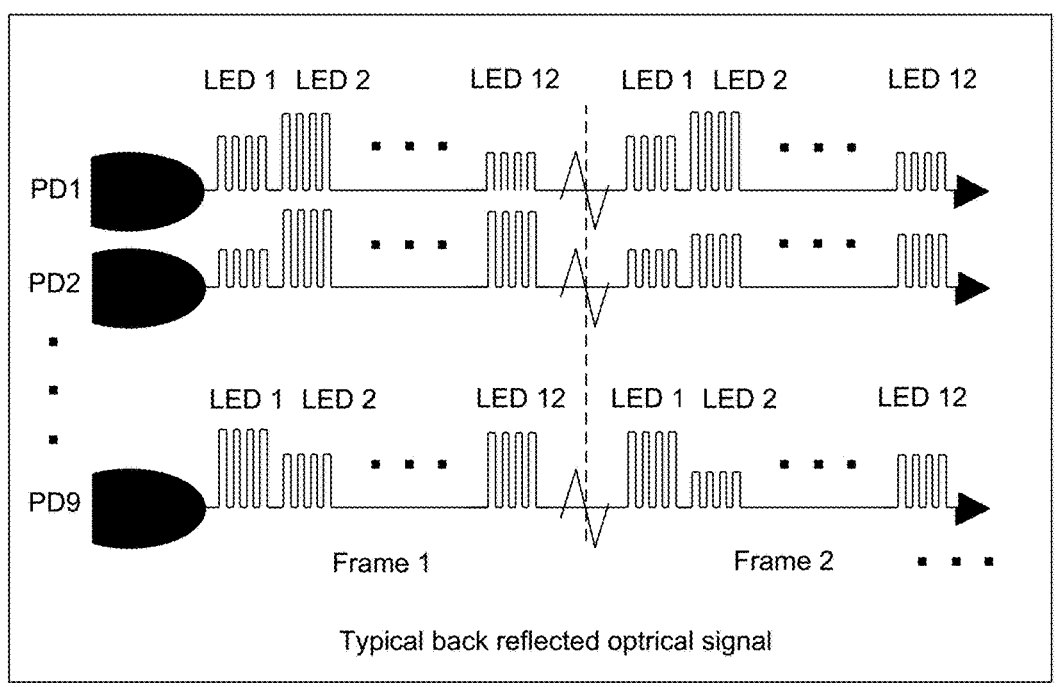
FIG. 6 is a diagram illustrating an example signal resulting from the reception of diffuse radiation from the LEDs in the HMD.

FIG. 6 is a diagram illustrating example pulse trains output by the photodiodes in the hand controller 103 upon receipt of pulsed, diffuse radiation from the LEDs in the HMD 105. In this example, there are nine photodiodes. Each photodiode in this example produces respective, distinct signals from each of the twelve LEDs illustrated in FIG. 1B. Because each photodiode has a different perspective with respect to the LEDs, each photodiode produces different signal trains.

Figure 7:
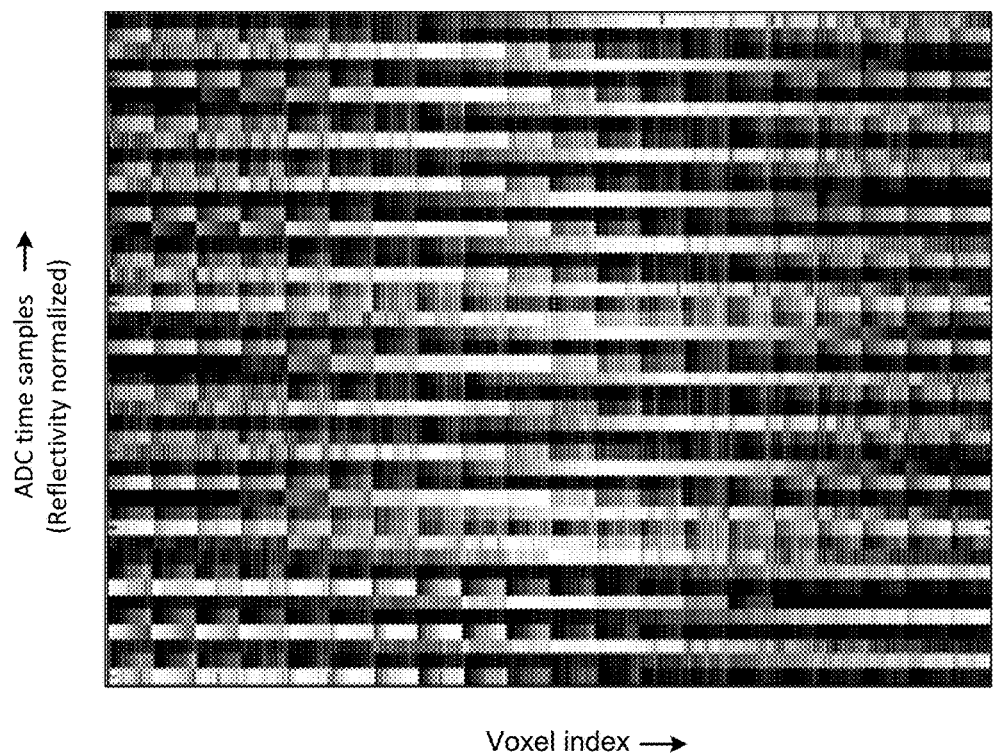
FIG. 7 is a diagram illustrating an example lookup table (LUT) from which position and orientation of the hand controller may be derived.

FIG. 7 is a diagram illustrating an example LUT 138. The LUT 139 as shown in FIG. 7 appears as a color plot but is actually a set of discrete patterns, indexed by voxel index and time. A voxel index is an integer function of the possible discrete positions and orientations that the hand controller may take. For example, the voxel index may be a rounded, weighted linear combination of each of the three position coordinates (X, Y, Z) and three angular coordinates (pitch, yaw, roll). These three position coordinates and three angular coordinates should be uniquely determined from a voxel index.

Each discrete element of the LUT 138 in FIG. 7 is a set of nine patterns, one for each photodiode arranged in the hand controller. Along these lines, the signal output from the ADC and band pass filter is split into two pieces: a first, short piece is used to determine the time, or phase, of the pattern, and a second, longer piece is used to determine the best voxel index. For the LUT 138 illustrated in FIG. 7, the best row is determined based on matching the first piece of the pattern to each of the patterns in a particular column. In some arrangements, the time is determined by finding the best row over more than one column by, e.g., averaging the patterns over column. The best voxel index is then found by searching through the best row.

Figure 8:
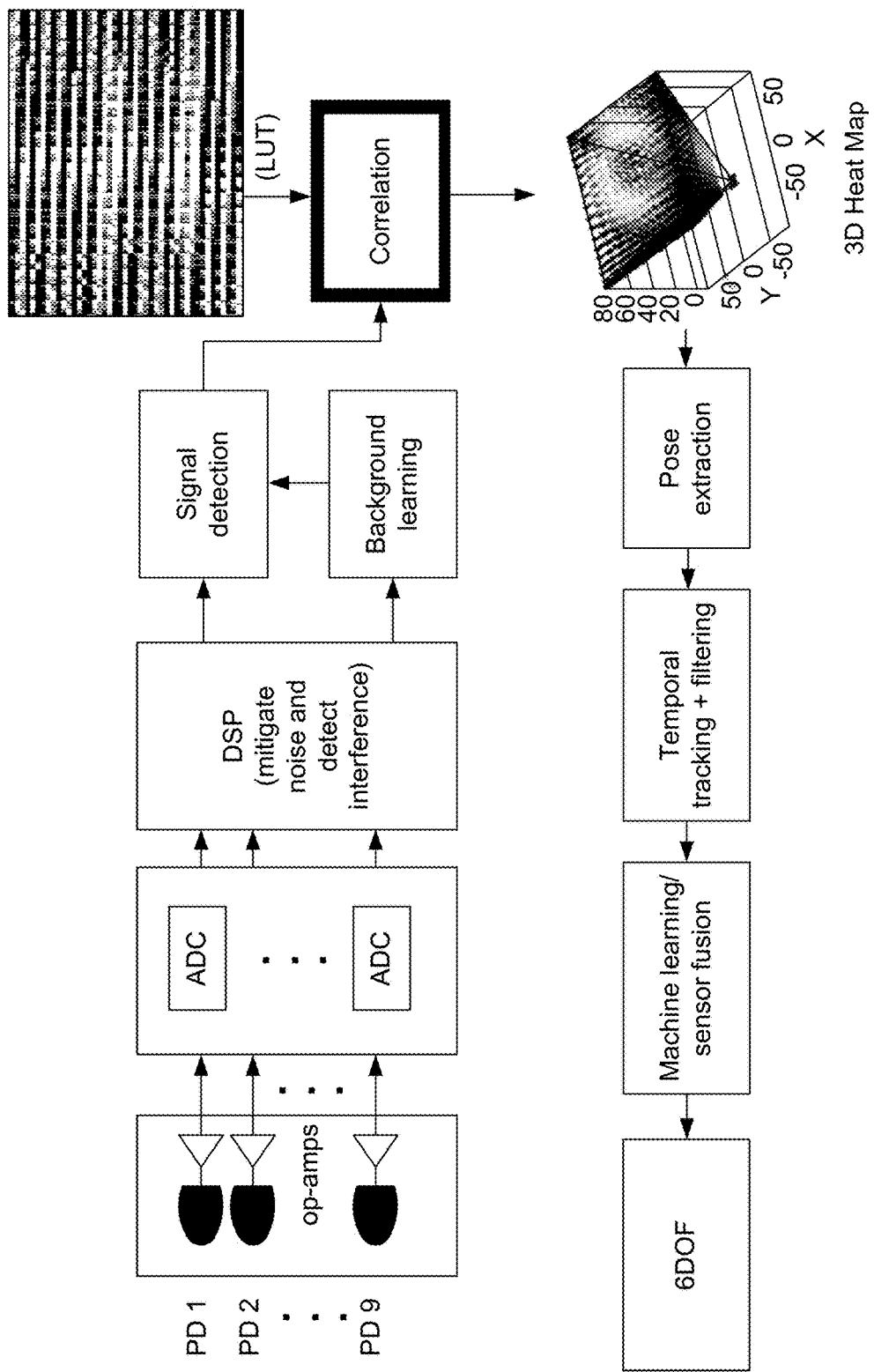
FIG. 8 is a flow chart illustrating an example process for deriving a heat map from the LUT and the signals generated by the photodiodes in response to receiving diffuse light from the LEDs.

FIG. 8 is a diagram illustrating an example process of determining the most likely position the hand controller 103 is taking. As shown in FIG. 8, an arrangement of photodiodes each outputs a signal to a respective ADC in response to receiving a pulse of diffuse radiation. Each ADC in turn outputs a digital signal that is input into a digital signal processor to mitigate noise and detect any interference with other signals. The final digital signal is then detected and input into a correlation operation with the LUT 138. The output of the correlation operation is a heat map over the voxels shown in FIG. 5.

The three-dimensional heat map over the voxels is a result of inverse mapping the voxel indices to positions in the three-dimensional object. This three-dimensional heat map then represents the likelihood of the hand controller being in the position represented by a voxel. In the example shown in FIG. 8, the bright regions represent the positions most likely taken by the hand controller and the dark regions represent the positions least likely taken by the hand controller.

In some implementations, the correlation operation produces the heat map by differencing a signal produced by each photodiode with a signal represented in the LUT and averaging the squares or absolute values of the differences to produce a metric. The color of the heat map may then be based on the value of the metric.

From the most likely position, a second three-dimensional heat map may be generated in a similar fashion for the orientation based on the voxel index and the most likely orientation of the hand controller may be derived from this second heat map.

Once a most likely pose is derived from the 3D heat maps, there is further temporal tracking and filtering to remove any noise caused by the voxels and external signals. This filtered result is then input into the VR system 100 as the pose of the hand controller for a particular instant of time.

Figure 9A:
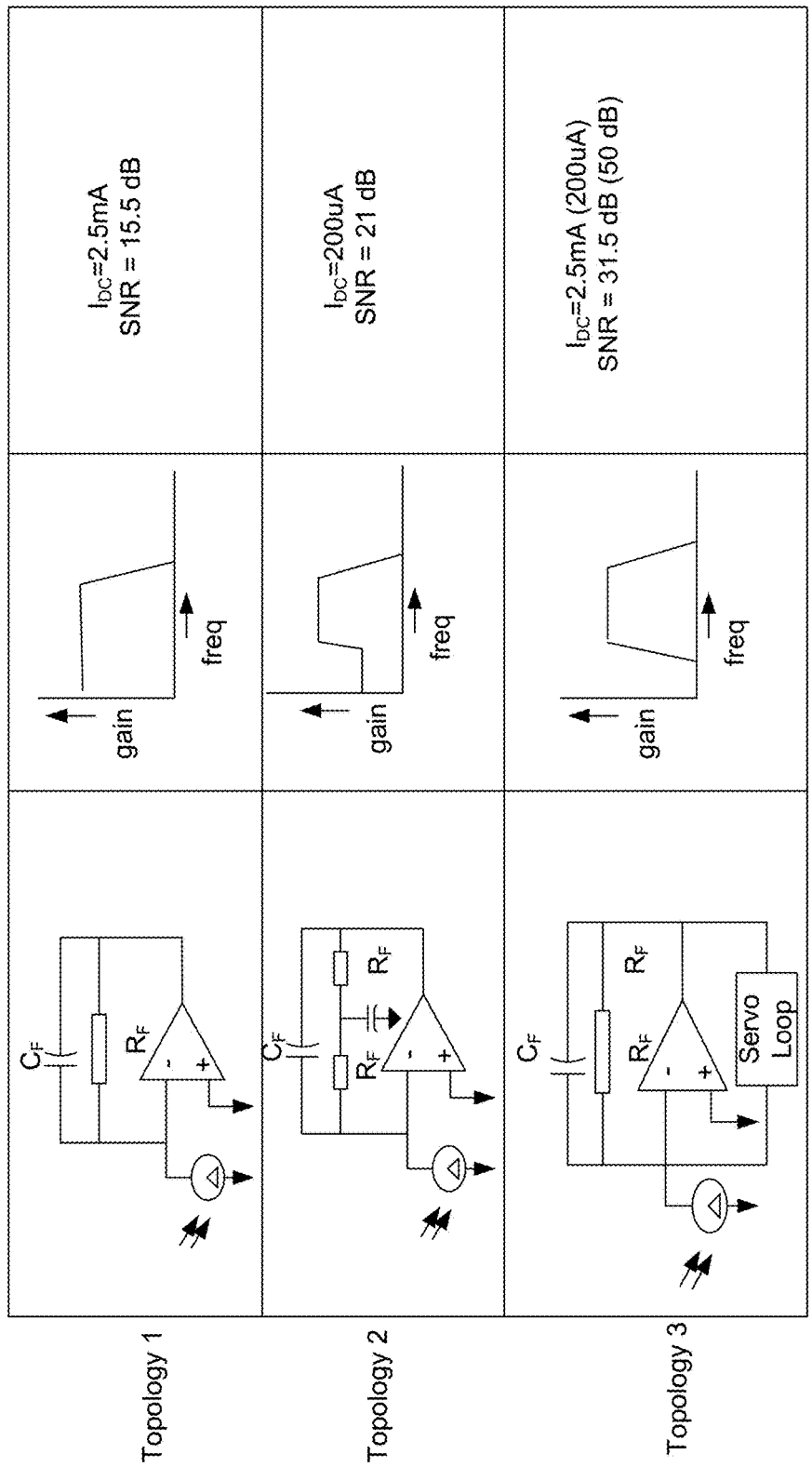
FIG. 9A is a diagram illustrating example circuit topologies for rejecting DC light from external sources.

FIG. 9A is a diagram illustrating an example set of circuit topologies for subtracting out DC noise current from a transimpedance amplifier (TIA) portion of the photodiode circuit. In the first topology illustrated ("Topology 1"), there is no additional circuitry to subtract out such DC current and the gain profile of the circuit has very large and unwanted low-frequency components that may represent sensitivity to ambient light. In the second topology illustrated ("Topology 2"), the circuitry has been altered to place two resistors on either side of a voltage divider. Such a divider may serve to draw low-frequency current away from the TIA output. The result is a decrease in the gain of the circuit at low frequencies, an improvement over the first topology.

The third topology ("Topology 3") has a servo loop connected to the output of the TIA and fed back into the TIA. The result is zero gain below a threshold frequency, indicating that low-frequency and DC current has been canceled out of the TIA as desired. Further detail of the servo loop is shown in FIG. 9b.

FIG. 9B is a diagram illustrating the servo loop in FIG. 9a that cancels out low-frequency and DC current in the TIA. The servo loop includes a second operational amplifier connected to the TIA output and a low-pass filter connected to the output of the operational amplifier and input back into the TIA. Low-frequency current is received at the operational amplifier, the low-frequency current producing a low-frequency voltage at the error amplifier. In response to receiving the low-frequency current, the operational amplifier generates a control voltage proportional to a difference between the low-frequency voltage and a reference voltage. The control voltage is then input into the low-pass filter, which then generates a negative current from the control voltage, the negative current drawing away the low-frequency current from the TIA more effectively than a voltage divider alone.

One or more of the elements and interfaces disclosed herein may be duplicated, implemented in the parallel, implemented in the singular, combined, divided, re-arranged, omitted, eliminated and/or implemented in any other way. Further, any of the disclosed elements and interfaces may be implemented by a processor, a computer and/or a machine having a processor, such as the example processor platforms P00 and P50 discussed below in connection with FIG. 10. Example processors include, but are not limited to a circuit, a programmable processor, fuses, an application-specific integrated circuit (ASIC), a programmable logic device (PLD), a field-programmable logic device (FPLD), a field-programmable gate array (FPGA), a digital signal processor (DSP), a graphics processing unit (GPU), a central processing unit (CPU), a microcontroller, a controller, etc. Any of the elements and interfaces disclosed herein may, for example, be implemented as instruction, program code, machine-readable instructions, etc. performed by one or more of a processor, a computer and/or a machine having a processor. A processor, a computer and/or a machine having a processor may be used, configured and/or programmed to execute and/or carry out the examples disclosed herein. For example, any of the examples may be embodied in instructions, program code, machine-readable instructions, etc. stored on a tangible and/or non-transitory computer-readable medium accessible by a processor, a computer and/or other machine having a processor, such as the example processor platforms P00 and P50 discussed below in connection with FIG. 10. Machine-readable instructions include, for example, instructions that cause a processor, a computer and/or a machine having a processor to perform one or more particular processes or methods. When a claim of this patent incorporating one or more of the elements of FIG. 10 is read to cover a purely software and/or firmware implementation, at least one of the elements of FIG. 10 is hereby expressly defined to include a tangible article of manufacture such as a tangible machine-readable medium storing machine-readable instructions such as the firmware and/or software.

The example methods disclosed herein may, for example, be implemented as instructions, program code, machine-readable instructions performed by a processor, a computer and/or other machine having a processor. A processor, a controller and/or any other suitable processing device such as those shown in FIG. 10 may be used, configured and/or programmed to execute and/or carry out the example methods. For example, they may be embodied in instructions, program code and/or machine-readable instructions stored on a tangible and/or non-transitory computer-readable medium accessible by a processor, a computer and/or other machine having a processor, such as those discussed below in connection with FIG. 10. Many other methods of implementing the example methods may be employed. For example, the order of execution may be changed, and/or one or more of the blocks and/or interactions described may be changed, eliminated, subdivided, or combined. Additionally, any or the entire example methods may be performed sequentially and/or performed in parallel by, for example, separate processing threads, processors, devices, discrete logic, circuits, etc.

As used herein, the terms "computer-readable medium" and "machine-readable medium" expressly exclude propagating signals. Example computer-readable or machine-readable medium include, but are not limited to, one or any combination of a volatile and/or non-volatile memory, a volatile and/or non-volatile memory device, a compact disc (CD), a digital versatile disc (DVD), a read-only memory (ROM), a random-access memory (RAM), a FLASH drive, a floppy disk, a Synchronous Dynamic Random Access Memory (SDRAM), a Dynamic Random Access Memory (DRAM), a RAMBUS Dynamic Random Access Memory (RDRAM) a programmable ROM (PROM), an electronically-programmable ROM (EPROM), an electronically-erasable PROM (EEPROM), a solid state (SS) memory, a solid state disk (SSD), an optical storage disk, an optical storage device, a magnetic storage disk, a network-attached storage (NAS) device, a magnetic storage device, a cache, and/or any other storage media in which information is stored for any duration (e.g., for extended time periods, permanently, brief instances, for temporarily buffering, and/or for caching of the information) and that can be accessed by a processor, a computer and/or other machine having a processor.

Figure 10:
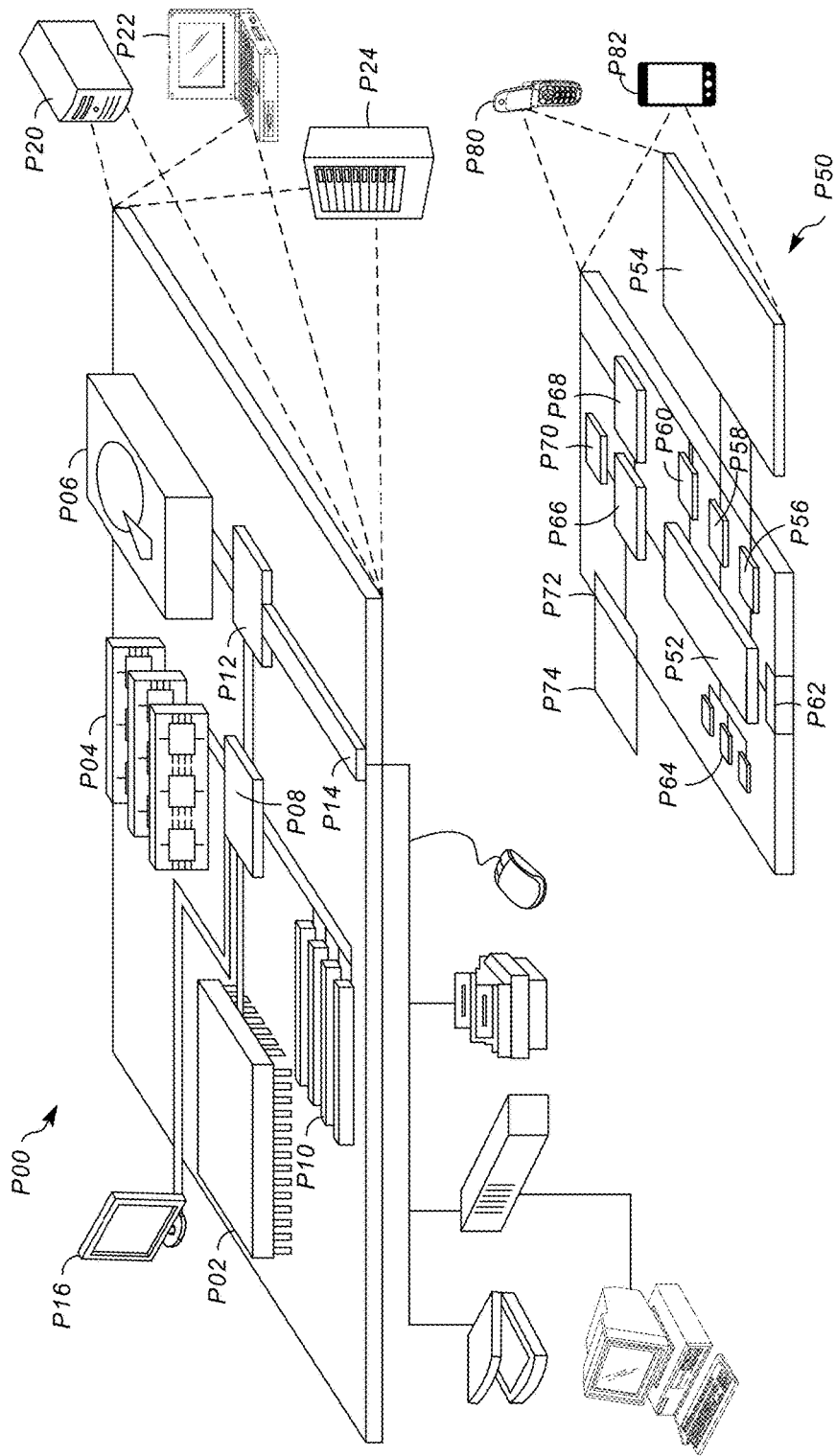
FIG. 10 illustrates an example of a computer device and a mobile computer device that can be used with circuits described here.

FIG. 10 shows an example of a generic computer device P00 and a generic mobile computer device P50, which may be used with the techniques described here. Computing device P00 is intended to represent various forms of digital computers, such as laptops, desktops, tablets, workstations, personal digital assistants, televisions, servers, blade servers, mainframes, and other appropriate computing devices. Computing device P50 is intended to represent various forms of mobile devices, such as personal digital assistants, cellular telephones, smart phones, and other similar computing devices. The components shown here, their connections and relationships, and their functions, are meant to be exemplary only, and are not meant to limit implementations of the inventions described and/or claimed in this document.

Computing device P00 includes a processor P02, memory P04, a storage device P06, a high-speed interface P08 connecting to memory P04 and high-speed expansion ports P10, and a low speed interface P12 connecting to low speed bus P14 and storage device P06. The processor P02 can be a semiconductor-based processor. The memory P04 can be a semiconductor-based memory. Each of the components P02, P04, P06, P08, P10, and P12, are interconnected using various busses, and may be mounted on a common motherboard or in other manners as appropriate. The processor P02 can process instructions for execution within the computing device P00, including instructions stored in the memory P04 or on the storage device P06 to display graphical information for a GUI on an external input/output device, such as display P16 coupled to high speed interface P08. In other implementations, multiple processors and/or multiple buses may be used, as appropriate, along with multiple memories and types of memory. Also, multiple computing devices P00 may be connected, with each device providing portions of the necessary operations (e.g., as a server bank, a group of blade servers, or a multi-processor system).

The memory P04 stores information within the computing device P00. In one implementation, the memory P04 is a volatile memory unit or units. In another implementation, the memory P04 is a non-volatile memory unit or units. The memory P04 may also be another form of computer-readable medium, such as a magnetic or optical disk.

The storage device P06 is capable of providing mass storage for the computing device P00. In one implementation, the storage device P06 may be or contain a computer-readable medium, such as a floppy disk device, a hard disk device, an optical disk device, or a tape device, a flash memory or other similar solid state memory device, or an array of devices, including devices in a storage area network or other configurations. A computer program product can be tangibly embodied in an information carrier. The computer program product may also contain instructions that, when executed, perform one or more methods, such as those described above. The information carrier is a computer- or machine-readable medium, such as the memory P04, the storage device P06, or memory on processor P02.

The high speed controller P08 manages bandwidth-intensive operations for the computing device P00, while the low speed controller P12 manages lower bandwidth-intensive operations. Such allocation of functions is exemplary only. In one implementation, the high-speed controller P08 is coupled to memory P04, display P16 (e.g., through a graphics processor or accelerator), and to high-speed expansion ports P10, which may accept various expansion cards (not shown). In the implementation, low-speed controller P12 is coupled to storage device P06 and low-speed expansion port P14. The low-speed expansion port, which may include various communication ports (e.g., USB, Bluetooth, Ethernet, wireless Ethernet) may be coupled to one or more input/output devices, such as a keyboard, a pointing device, a scanner, or a networking device such as a switch or router, e.g., through a network adapter.

The computing device P00 may be implemented in a number of different forms, as shown in the figure. For example, it may be implemented as a standard server P20, or multiple times in a group of such servers. It may also be implemented as part of a rack server system P24. In addition, it may be implemented in a personal computer such as a laptop computer P22. Alternatively, components from computing device P00 may be combined with other components in a mobile device (not shown), such as device P50. Each of such devices may contain one or more of computing device P00, P50, and an entire system may be made up of multiple computing devices P00, P50 communicating with each other.

Computing device P50 includes a processor P52, memory P64, an input/output device such as a display P54, a communication interface P66, and a transceiver P68, among other components. The device P50 may also be provided with a storage device, such as a microdrive or other device, to provide additional storage. Each of the components P50, P52, P64, P54, P66, and P68, are interconnected using various buses, and several of the components may be mounted on a common motherboard or in other manners as appropriate.

The processor P52 can execute instructions within the computing device P50, including instructions stored in the memory P64. The processor may be implemented as a chipset of chips that include separate and multiple analog and digital processors. The processor may provide, for example, for coordination of the other components of the device P50, such as control of user interfaces, applications run by device P50, and wireless communication by device P50.

Processor P52 may communicate with a user through control interface P58 and display interface P56 coupled to a display P54. The display P54 may be, for example, a TFT LCD (Thin-Film-Transistor Liquid Crystal Display) or an OLED (Organic Light Emitting Diode) display, or other appropriate display technology. The display interface P56 may comprise appropriate circuitry for driving the display P54 to present graphical and other information to a user. The control interface P58 may receive commands from a user and convert them for submission to the processor P52. In addition, an external interface P62 may be provided in communication with processor P52, so as to enable near area communication of device P50 with other devices. External interface P62 may provide, for example, for wired communication in some implementations, or for wireless communication in other implementations, and multiple interfaces may also be used.

The memory P64 stores information within the computing device P50. The memory P64 can be implemented as one or more of a computer-readable medium or media, a volatile memory unit or units, or a non-volatile memory unit or units. Expansion memory P74 may also be provided and connected to device P50 through expansion interface P72, which may include, for example, a SIMM (Single In Line Memory Module) card interface. Such expansion memory P74 may provide extra storage space for device P50, or may also store applications or other information for device P50. Specifically, expansion memory P74 may include instructions to carry out or supplement the processes described above, and may include secure information also. Thus, for example, expansion memory P74 may be provided as a security module for device P50, and may be programmed with instructions that permit secure use of device P50. In addition, secure applications may be provided via the SIMM cards, along with additional information, such as placing identifying information on the SIMM card in a non-hackable manner.

The memory may include, for example, flash memory and/or NVRAM memory, as discussed below. In one implementation, a computer program product is tangibly embodied in an information carrier. The computer program product contains instructions that, when executed, perform one or more methods, such as those described above. The information carrier is a computer- or machine-readable medium, such as the memory P64, expansion memory P74, or memory on processor P52 that may be received, for example, over transceiver P68 or external interface P62.

Device P50 may communicate wirelessly through communication interface P66, which may include digital signal processing circuitry where necessary. Communication interface P66 may provide for communications under various modes or protocols, such as GSM voice calls, SMS, EMS, or MMS messaging, CDMA, TDMA, PDC, WCDMA, CDMA2000, or GPRS, among others. Such communication may occur, for example, through radio-frequency transceiver P68. In addition, short-range communication may occur, such as using a Bluetooth, Wi-Fi, or other such transceiver (not shown). In addition, GPS (Global Positioning System) receiver module P70 may provide additional navigation- and location-related wireless data to device P50, which may be used as appropriate by applications running on device P50.

Device P50 may also communicate audibly using audio codec P60, which may receive spoken information from a user and convert it to usable digital information. Audio codec P60 may likewise generate audible sound for a user, such as through a speaker, e.g., in a handset of device P50. Such sound may include sound from voice telephone calls, may include recorded sound (e.g., voice messages, music files, etc.) and may also include sound generated by applications operating on device P50.

The computing device P50 may be implemented in a number of different forms, as shown in the figure. For example, it may be implemented as a cellular telephone P80. It may also be implemented as part of a smart phone P82, personal digital assistant, or other similar mobile device.

Figure 11:
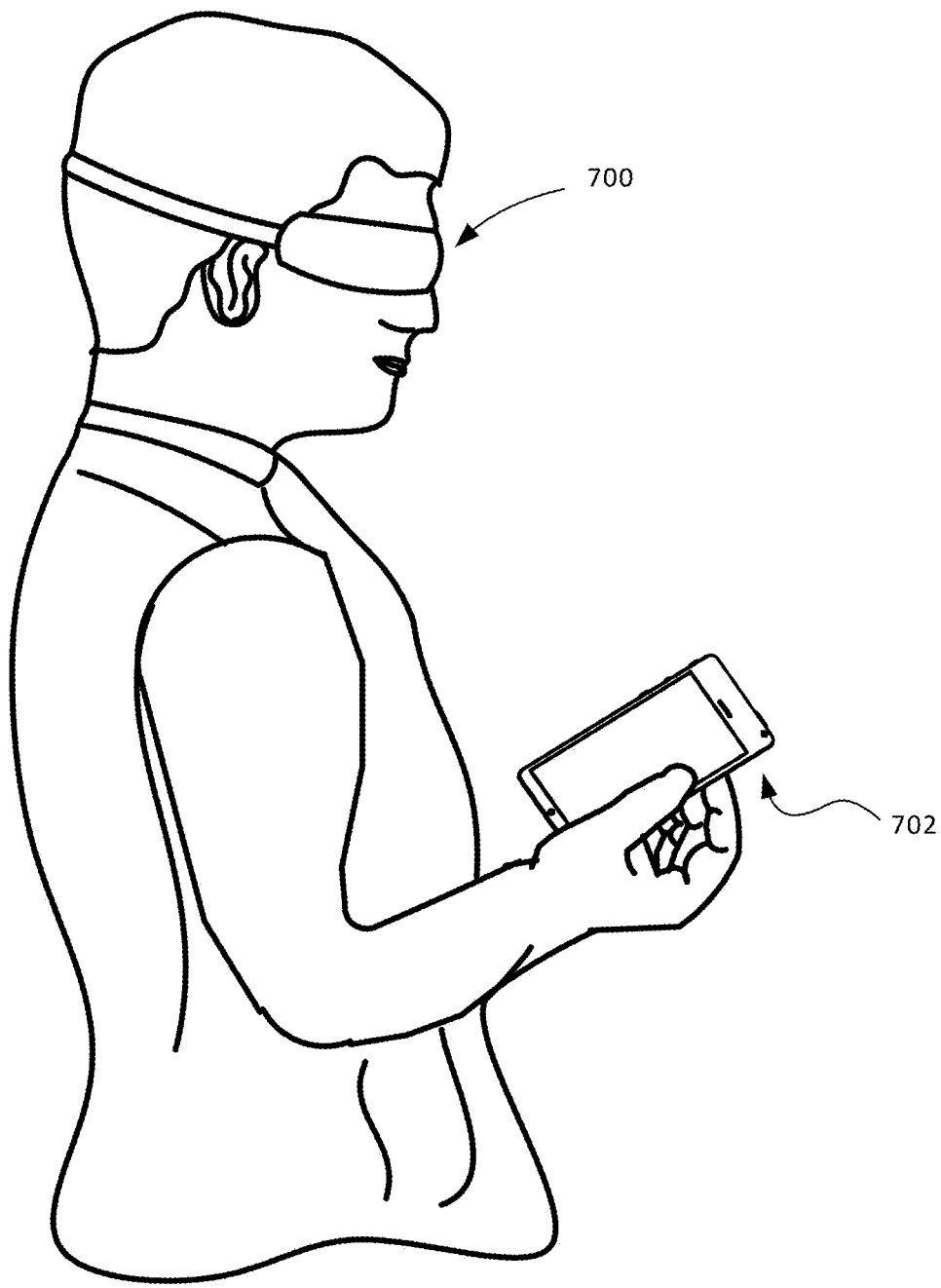
FIG. 11 is a diagram depicting an example VR head-mounted display (HMD).

FIG. 11 illustrates an example implementation of a head-mounted display as shown in FIG. 1A. In FIG. 11, a user wearing an HMD 700 is holding a portable handheld electronic device 702. The handheld electronic device 702 may be, for example, a smartphone, a controller, a joystick, or another portable handheld electronic device(s) that may be paired with, and communicate with, the HMD 700 for interaction in the immersive virtual environment generated by the HMD 700. The handheld electronic device 702 may be operably coupled with, or paired with the HMD 700 via, for example, a wired connection, or a wireless connection such as, for example, a WiFi or Bluetooth connection. This pairing, or operable coupling, of the handheld electronic device 702 and the HMD 700 may provide for communication between the handheld electronic device 702 and the HMD 700 and the exchange of data between the handheld electronic device 702 and the HMD 700. This may allow the handheld electronic device 602 to function as a controller in communication with the HMD 700 for interacting in the immersive virtual environment generated by the HMD 700. That is, a manipulation of the handheld electronic device 702, such as, for example, a beam or ray emitted by the handheld electronic device 702 and directed to a virtual object or feature for selection, and/or an input received on a touch surface of the handheld electronic device 702, and/or a movement of the handheld electronic device 702, may be translated into a corresponding selection, or movement, or other type of interaction, in the immersive virtual environment generated by the HMD 700. For example, the HMD 700, together with the handheld electronic device 702, may generate a virtual environment as described above, and the handheld electronic device 702 may be manipulated to effect a change in scale, or perspective, of the user relative to the virtual features in the virtual environment as described above.

FIGS. 12A and 12B are perspective views of an example HMD, such as, for example, the HMD 700 worn by the user in FIG. 11, and FIG. 12C illustrates an example handheld electronic device, such as, for example, the handheld electronic device 702 shown in FIG. 11.

The handheld electronic device 802 may include a housing 803 in which internal components of the device 802 are received, and a user interface 804 on an outside of the housing 803, accessible to the user. The user interface 804 may include a touch sensitive surface 806 configured to receive user touch inputs. The user interface 804 may also include other components for manipulation by the user such as, for example, actuation buttons, knobs, joysticks and the like. In some implementations, at least a portion of the user interface 804 may be configured as a touchscreen, with that portion of the user interface 804 being configured to display user interface items to the user, and also to receive touch inputs from the user on the touch sensitive surface 806. The handheld electronic device 802 may also include a light source 808 configured to selectively emit light, for example, a beam or ray, through a port in the housing 803, for example, in response to a user input received at the user interface 804.

The HMD 800 may include a housing 810 coupled to a frame 820, with an audio output device 830 including, for example, speakers mounted in headphones, also be coupled to the frame 820. In FIG. 8B, a front portion 810a of the housing 810 is rotated away from a base portion 810b of the housing 810 so that some of the components received in the housing 810 are visible. A display 840 may be mounted on an interior facing side of the front portion 810a of the housing 810. Lenses 850 may be mounted in the housing 810, between the user's eyes and the display 840 when the front portion 810a is in the closed position against the base portion 810b of the housing 810. In some implementations, the HMD 800 may include a sensing system 860 including various sensors and a control system 870 including a processor 890 and various control system devices to facilitate operation of the HMD 800.

In some implementations, the HMD 800 may include a camera 880 to capture still and moving images. The images captured by the camera 880 may be used to help track a physical position of the user and/or the handheld electronic device 802 in the real world, or physical environment relative to the virtual environment, and/or may be displayed to the user on the display 840 in a pass through mode, allowing the user to temporarily leave the virtual environment and return to the physical environment without removing the HMD 800 or otherwise changing the configuration of the HMD 800 to move the housing 810 out of the line of sight of the user.

In some implementations, the HMD 800 may include a gaze tracking device 865 to detect and track an eye gaze of the user. The gaze tracking device 865 may include, for example, an image sensor 865A, or multiple image sensors 865A, to capture images of the user's eyes, for example, a particular portion of the user's eyes, such as, for example, the pupil, to detect, and track direction and movement of, the user's gaze. In some implementations, the HMD 800 may be configured so that the detected gaze is processed as a user input to be translated into a corresponding interaction in the immersive virtual experience.

Various implementations of the systems and techniques described here can be realized in digital electronic circuitry, integrated circuitry, specially designed ASICs (application specific integrated circuits), computer hardware, firmware, software, and/or combinations thereof. These various implementations can include implementation in one or more computer programs that are executable and/or interpretable on a programmable system including at least one programmable processor, which may be special or general purpose, coupled to receive data and instructions from, and to transmit data and instructions to, a storage system, at least one input device, and at least one output device.

These computer programs (also known as programs, software, software applications or code) include machine instructions for a programmable processor, and can be implemented in a high-level procedural and/or object-oriented programming language, and/or in assembly/machine language. As used herein, the terms "machine-readable medium" "computer-readable medium" refers to any computer program product, apparatus and/or device (e.g., magnetic discs, optical disks, memory, Programmable Logic Devices (PLDs)) used to provide machine instructions and/or data to a programmable processor, including a machine-readable medium that receives machine instructions as a machine-readable signal. The term "machine-readable signal" refers to any signal used to provide machine instructions and/or data to a programmable processor.

To provide for interaction with a user, the systems and techniques described here can be implemented on a computer having a display device (e.g., a CRT (cathode ray tube) or LCD (liquid crystal display) monitor) for displaying information to the user and a keyboard and a pointing device (e.g., a mouse or a trackball) by which the user can provide input to the computer. Other kinds of devices can be used to provide for interaction with a user as well; for example, feedback provided to the user can be any form of sensory feedback (e.g., visual feedback, auditory feedback, or tactile feedback); and input from the user can be received in any form, including acoustic, speech, or tactile input.

The systems and techniques described here can be implemented in a computing system that includes a back end component (e.g., as a data server), or that includes a middleware component (e.g., an application server), or that includes a front end component (e.g., a client computer having a graphical user interface or a Web browser through which a user can interact with an implementation of the systems and techniques described here), or any combination of such back end, middleware, or front end components. The components of the system can be interconnected by any form or medium of digital data communication (e.g., a communication network). Examples of communication networks include a local area network ("LAN"), a wide area network ("WAN"), and the Internet.

The computing system can include clients and servers. A client and server are generally remote from each other and typically interact through a communication network. The relationship of client and server arises by virtue of computer programs running on the respective computers and having a client-server relationship to each other.

A number of embodiments have been described. Nevertheless, it will be understood that various modifications may be made without departing from the spirit and scope of the specification.

It will also be understood that when an element is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element, there are no intervening elements present. Although the terms directly on, directly connected to, or directly coupled to may not be used throughout the detailed description, elements that are shown as being directly on, directly connected or directly coupled can be referred to as such. The claims of the application may be amended to recite exemplary relationships described in the specification or shown in the figures.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

In addition, the logic flows depicted in the figures do not require the particular order shown, or sequential order, to achieve desirable results. In addition, other steps may be provided, or steps may be eliminated, from the described flows, and other components may be added to, or removed from, the described systems. Accordingly, other embodiments are within the scope of the following claims. Although certain example methods, apparatuses and articles of manufacture have been described herein, the scope of coverage of this patent is not limited thereto. It is to be understood that terminology employed herein is for the purpose of describing particular aspects, and is not intended to be limiting. On the contrary, this patent covers all methods, apparatus and articles of manufacture fairly falling within the scope of the claims of this patent.

EXAMPLE EMBODIMENTS

Embodiment 1

In a virtual reality (VR) system including a hand controller and a head-mounted display (HMD), a method of tracking a position and orientation of the hand controller, the method comprising:
receiving, by processing circuitry, a pulse of diffuse electromagnetic radiation from a plurality of radiation transmitters placed in the HMD;
generating, by the processing circuitry, a digital signal from the diffuse electromagnetic radiation; and
obtaining, by the processing circuitry, a position and an orientation of the hand controller based on the digital signal.

Embodiment 2

The method as in embodiment 1, wherein obtaining the position and orientation of the hand controller based on the digital signal includes:
comparing the digital signal to a plurality of signal representations of a lookup table (LUT), each of the plurality of signal representations corresponding to a respective position and orientation of the hand controller.

Embodiment 3

The method as in embodiment 1 or 2, wherein each predetermined signal representation of the plurality of signal representations of the LUT includes a respective signal portion for each of the plurality of radiation transmitters placed in the HMD.

Embodiment 4

The method as in embodiment 2 or 3, wherein each predetermined signal representation of the plurality of signal representations of the LUT corresponds to a time at which the pulse of diffuse radiation is transmitted from the plurality of diffuse radiation transmitters in the HMD.

Embodiment 5

The method as in embodiment 4, wherein the digital signal includes a first portion and a second portion;
wherein comparing the digital signal to the predetermined signal representation of the plurality of signal representations of the LUT includes:
  producing the time at which the pulse of diffuse radiation is transmitted from the plurality of diffuse radiation transmitters in the HMD based on the first portion of the digital signal; and
  producing the position and orientation of the hand controller based on the second portion of the signal and the time at which the pulse of diffuse radiation is transmitted from the plurality of diffuse radiation transmitters in the HMD.

Embodiment 6

The method as in any one of embodiments 2 to 5, wherein the plurality of diffuse radiation transmitters are arranged in a specified angular pattern within the HMD.

Embodiment 7

The method as in any one of embodiments 2 to 6, wherein the processing circuitry includes a photodiode,
wherein the method further comprises generating the LUT offline by performing a simulation of a response of the photodiode to illumination from each of the diffuse radiation transmitters in the HMD, the photodiode response having a transfer function that has a noise profile and a signal profile, the signal profile being zero outside of a specified frequency band having an upper frequency and a lower frequency, the noise profile including 1/f noise below a critical frequency below the lower frequency of the frequency band of the signal profile.

Embodiment 8

The method as in any one of embodiments 2 to 7, wherein comparing the digital signal to the plurality of signal representations of the LUT includes:
generating a heat map indicative of the closeness of a signal representation in the LUT to the detected pattern of diffuse radiation, the heat map including a hot region in which signal representations correspond to the detected pattern of diffuse radiation and a cool region in which signal representations do not correspond to the detected pattern of diffuse radiation; and selecting a signal representation in the hot region of the heat map.

Embodiment 9

The method as in embodiment 8, wherein the heat map is plotted in three-dimensional position space, and
wherein selecting the signal representation in the hot region of the LUT includes identifying a position of the hand controller as a coordinate triplet in the hot region of the heat map.

Embodiment 10

The method as in embodiment 9, wherein selecting the signal representation in the hot region of the LUT further includes:
generating a second heat map at the coordinate triplet in the hot region of the heat map identified as the position of the hand controller, the second heat map being plotted in a three-dimensional pitch-yaw-roll angle space, the second heat map including a hot region in which signal representations correspond to the detected pattern of diffuse radiation and a cool region in which signal representations do not correspond to the detected pattern of diffuse radiation; and
selecting a signal representation in the hot region of the second heat map.

Embodiment 11

The method as in any one of embodiments 2 to 10, wherein the hand controller includes (i) a transimpedance amplifier (TIA) configured to produce a first current from the pulse of diffuse electromagnetic radiation and a second current from external radiation received from radiation sources external to the plurality of radiation transmitters placed in the HMD and (ii) an error amplifier configured to cancel the second current;
wherein the method further comprises:
  receiving the second current at the error amplifier, the second current producing a second voltage at the error amplifier;
  in response to receiving the second current, generating a control voltage proportional to a difference between the second voltage and a reference voltage; and
  generating a negative current from the control voltage, the negative current drawing away the second current from the TIA.

Embodiment 12

A computer program product comprising a nontransitory storage medium, the computer program product including code that, when executed by processing circuitry of a hand controller of a virtual reality (VR) system that also includes a head-mounted display (HMD), causes the processing circuitry to perform a method, the method comprising:
receiving a pulse of diffuse electromagnetic radiation from a plurality of radiation transmitters placed in the HMD;
generating a digital signal from the diffuse electromagnetic radiation; and
obtaining a position and an orientation of the hand controller based on the digital signal.

Embodiment 13

The computer program product as in embodiment 12, wherein obtaining the position and orientation of the hand controller based on the digital signal includes:

comparing the digital signal to a plurality of signal representations of a lookup table (LUT), each of the plurality of signal representations corresponding to a respective position and orientation of the hand controller.

Embodiment 14

The computer program product as in embodiment 13, wherein each predetermined signal representation of the plurality of signal representations of the LUT includes a respective signal portion for each of the plurality of radiation transmitters placed in the HMD.

Embodiment 15

A virtual reality (VR) system comprising a head-mounted display (HMD) and a hand controller, the VR system including:
memory; and
controlling circuitry coupled to the memory, the controlling circuitry being configured to:
  receive a pulse of diffuse electromagnetic radiation from a plurality of radiation transmitters placed in the HMD;
  generate a digital signal from the diffuse electromagnetic radiation; and
  obtain a position and an orientation of the hand controller based on the digital signal.

What is claimed is:

1. A method, comprising:
receiving, by processing circuitry of a virtual reality (VR) system including a hand controller and a head-mounted display (HMD), a pulse of diffuse electromagnetic radiation at a plurality of detectors included in the hand controller from a plurality of radiation transmitters included in the HMD, each of the plurality of detectors receiving the pulse of diffuse electromagnetic radiation from a different perspective than a perspective from which another detector of the plurality of detectors receives the pulse of diffuse electromagnetic radiation, the perspective from which each of the plurality of detectors receives the pulse of diffuse electromagnetic radiation being based on a position of that detector in the hand controller;
generating, by the processing circuitry, a plurality of digital signals, each of the plurality of digital signals being generated at a respective detector of the plurality of detectors based on the perspective from which the diffuse electromagnetic radiation is received at that detector; and
obtaining, by the processing circuitry, a position and an orientation of the hand controller based on the plurality of digital signals.

2. The method as in claim 1, wherein obtaining the position and orientation of the hand controller based on the plurality of digital signals includes:
comparing a digital signal of the plurality of digital signals to a plurality of signal representations of a lookup table (LUT), each of the plurality of signal representations corresponding to a respective position and orientation of the hand controller.

3. The method as in claim 2, wherein each predetermined signal representation of the plurality of signal representations of the LUT includes a respective signal portion for each of the plurality of radiation transmitters placed in the HMD.

4. The method as in claim 2, wherein each predetermined signal representation of the plurality of signal representations of the LUT corresponds to a time at which the pulse of diffuse radiation is transmitted from the plurality of radiation transmitters in the HMD.

5. The method as in claim 4, wherein each of the plurality of digital signals includes a first portion and a second portion;
wherein comparing the digital signal to the predetermined signal representation of the plurality of signal representations of the LUT includes:
  producing the time at which the pulse of diffuse radiation is transmitted from the plurality of radiation transmitters in the HMD based on the first portion of the digital signal; and
  producing the position and orientation of the hand controller based on the second portion of the signal and the time at which the pulse of radiation is transmitted from the plurality of radiation transmitters in the HMD.

6. The method as in claim 2, wherein the plurality of radiation transmitters are arranged in a specified angular pattern within the HMD.

7. The method as in claim 2, wherein the processing circuitry includes a photodiode,
wherein the method further comprises generating the LUT offline by performing a simulation of a response of the photodiode to illumination from each of the radiation transmitters in the HMD, the photodiode response having a transfer function that has a noise profile and a signal profile, the signal profile being zero outside of a specified frequency band having an upper frequency and a lower frequency, the noise profile including 1/f noise below a critical frequency below the lower frequency of the frequency band of the signal profile.

8. The method as in claim 2, wherein comparing the digital signal to the plurality of signal representations of the LUT includes:
generating a heat map indicative of the closeness of a signal representation in the LUT to the digital signal, the heat map including a hot region in which signal representations correspond to the digital signal and a cool region in which signal representations do not correspond to the digital signal; and
selecting a signal representation in the hot region of the heat map.

9. The method as in claim 8, wherein the heat map is plotted in three-dimensional position space, and
wherein selecting the signal representation in the hot region of the LUT includes identifying a position of the hand controller as a coordinate triplet in the hot region of the heat map.

10. The method as in claim 9, wherein selecting the signal representation in the hot region of the LUT further includes:
generating a second heat map at the coordinate triplet in the hot region of the heat map identified as the position of the hand controller, the second heat map being plotted in a three-dimensional pitch-yaw-roll angle space, the second heat map including a hot region in which signal representations correspond to the digital signal and a cool region in which signal representations do not correspond to the digital signal; and
selecting a signal representation in the hot region of the second heat map.

11. The method as in claim 2, wherein the hand controller includes (i) a transimpedance amplifier (TIA) configured to produce a first current from the pulse of diffuse electromagnetic radiation and a second current from external radiation received from radiation sources external to the plurality of radiation transmitters placed in the HMD and (ii) an error amplifier configured to cancel the second current;

wherein the method further comprises:

receiving the second current at the error amplifier, the second current producing a second voltage at the error amplifier;

in response to receiving the second current, generating a control voltage proportional to a difference between the second voltage and a reference voltage; and generating a negative current from the control voltage, the negative current drawing away the second current from the TIA.

12. A computer program product comprising a nontransitory storage medium, the computer program product including code that, when executed by processing circuitry of a hand controller of a virtual reality (VR) system that also includes a head-mounted display (HMD), causes the processing circuitry to perform a method, the method comprising:

receiving a pulse of diffuse electromagnetic radiation at a plurality of detectors included in the hand controller from a plurality of radiation transmitters included in the HMD, each of the plurality of detectors receiving the pulse of diffuse electromagnetic radiation from a different perspective than a perspective from which another detector of the plurality of detectors receives the pulse of diffuse electromagnetic radiation, the perspective from which each of the plurality of detectors receives the pulse of diffuse electromagnetic radiation being based on a position of that detector in the hand controller;

generating a plurality of digital signals, each of the plurality of digital signals being generated at a respective detector of the plurality of detectors from based on the perspective from which the diffuse electromagnetic radiation is received at that detector: and obtaining a position and an orientation of the hand controller based on the plurality of digital signals.

13. The computer program product as in claim 12, wherein obtaining the position and orientation of the hand controller based on the plurality of digital signals includes:

comparing a digital signal of the plurality of digital signals to a plurality of signal representations of a lookup table (LUT), each of the plurality of signal representations corresponding to a respective position and orientation of the hand controller.

14. The computer program product as in claim 13, wherein each predetermined signal representation of the plurality of signal representations of the LUT includes a respective signal portion for each of the plurality of radiation transmitters placed in the HMD.

15. The computer program product as in claim 13, wherein each predetermined signal representation of the plurality of signal representations of the LUT corresponds to a time at which the pulse of diffuse radiation is transmitted from the plurality of radiation transmitters in the HMD.

16. The computer program product as in claim 13, wherein the plurality of radiation transmitters are arranged in a specified angular pattern within the HMD.

17. The computer program product as in claim 13, wherein the processing circuitry includes a photodiode, wherein the method further comprises generating the LUT offline by performing a simulation of a response of the photodiode to illumination from each of the radiation transmitters in the HMD, the photodiode response having a transfer function that has a noise profile and a signal profile, the signal profile being zero outside of a specified frequency band having an upper frequency and a lower frequency, the noise profile including 1/f noise below a critical frequency below the lower frequency of the frequency band of the signal profile.

18. The computer program product as in claim 13, wherein comparing the digital signal to the plurality of signal representations of the LUT includes:

generating a heat map indicative of the closeness of a signal representation in the LUT to the digital signal, the heat map including a hot region in which signal representations correspond to the digital signal and a cool region in which signal representations do not correspond to the digital signal; and selecting a signal representation in the hot region of the heat map.

19. The computer program product as in claim 13, wherein the hand controller includes (i) a transimpedance amplifier (TIA) configured to produce a first current from the pulse of diffuse electromagnetic radiation and a second current from external radiation received from radiation sources external to the plurality of radiation transmitters placed in the HMD and (ii) an error amplifier configured to cancel the second current;

wherein the method further comprises:

receiving the second current at the error amplifier, the second current producing a second voltage at the error amplifier;

in response to receiving the second current, generating a control voltage proportional to a difference between the second voltage and a reference voltage; and generating a negative current from the control voltage, the negative current drawing away the second current from the TIA.

20. A virtual reality (VR) system comprising a head-mounted display (HMD) and a hand controller, the VR system including:

memory; and controlling circuitry coupled to the memory, the controlling circuitry being configured to:

receive a pulse of diffuse electromagnetic radiation at a plurality of detectors included in the hand controller from a plurality of radiation transmitters included in the HMD, each of the plurality of detectors receiving the pulse of diffuse electromagnetic radiation from a different perspective than a perspective from which another detector of the plurality of detectors receives the pulse of diffuse electromagnetic radiation, the perspective from which each of the plurality of detectors receives the pulse of diffuse electromagnetic radiation being based on a position of that detector in the hand controller;

generate a plurality of digital signals, each of the plurality of digital signals being generated at a respective detector of the plurality of detectors based on the perspective from which the diffuse electromagnetic radiation is received at that detector: and obtain a position and an orientation of the hand controller based on the plurality of digital signals.

* * * * *